United States Patent [19]

Enge

[11] Patent Number: 5,402,094
[45] Date of Patent: Mar. 28, 1995

[54] MRI MAMMOGRAPHY MAGNET

[76] Inventor: Harald A. Enge, 25 Hillside Rd., Lincoln, Mass. 01773

[21] Appl. No.: 290,687
[22] Filed: Aug. 15, 1994
[51] Int. Cl.6 .................. G01R 33/20; H01F 3/00; H01F 5/00
[52] U.S. Cl. ................... 335/296; 335/299; 128/653.5; 324/319
[58] Field of Search ............ 335/216, 289, 296, 299; 310/11; 128/653.1, 653.5; 324/318, 319, 320

[56] References Cited

U.S. PATENT DOCUMENTS

| | | | |
|---|---|---|---|
| 4,701,736 | 10/1987 | McDougall et al. | 335/299 |
| 4,721,914 | 1/1988 | Fukushima et al. | 324/320 |
| 4,855,703 | 8/1989 | Bessho et al. | 335/296 |
| 4,857,874 | 8/1989 | Bessho et al. | 335/296 |
| 4,987,398 | 1/1991 | Bessho | 335/299 |
| 5,117,188 | 5/1992 | Ohkawa | 324/318 |
| 5,337,001 | 8/1994 | McDougall et al. | 324/318 |

Primary Examiner—Leo P. Picard
Assistant Examiner—Raymond M. Barrera
Attorney, Agent, or Firm—Nields & Lemack

[57] ABSTRACT

A magnet is specially designed for the creation of an extremely uniform magnetic field in a small volume for use in MRI mammography. A disk of ferromagnetic material has a surface having a well adapted to receive the object to be examined and lined with a solenoidal coil which provides the basic magnetic field. Uniformity is increased by three additional coils surrounding the solenoidal coil and placed in annular slots surrounding the well. Of these three additional coils, the middle one generates a magnetic field in the well which opposes the basic magnetic field, and the others supplement the basic magnetic field. The ampereturns of the three additional coils are selected to maximize uniformity of the magnetic field in the well.

13 Claims, 4 Drawing Sheets

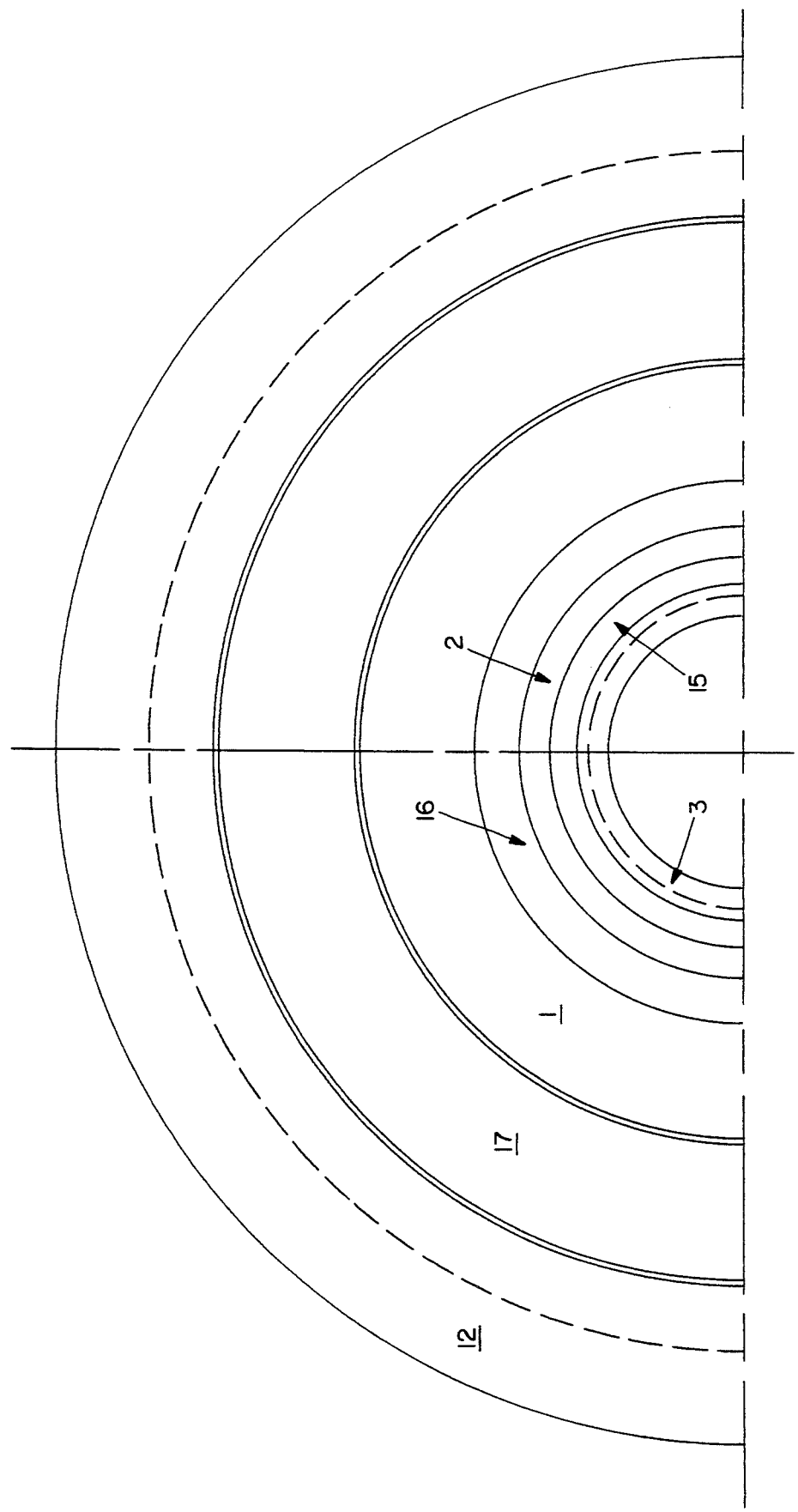

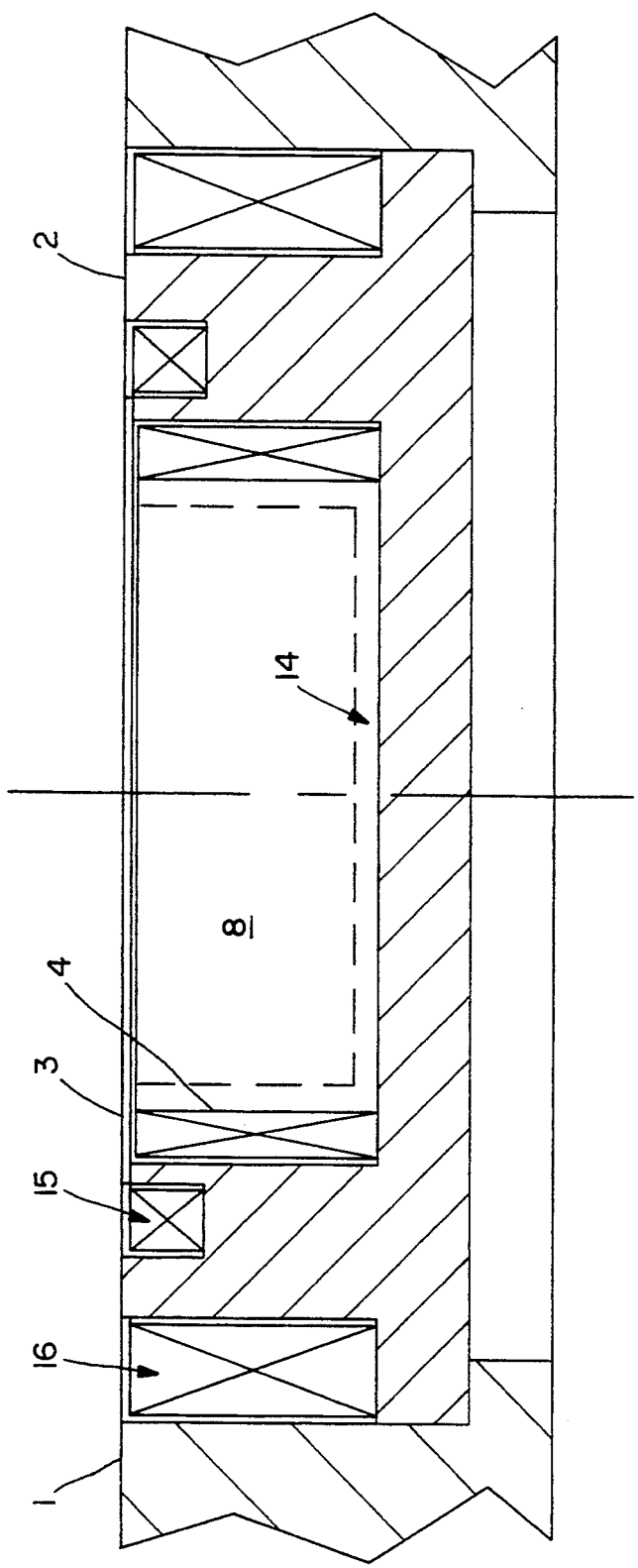

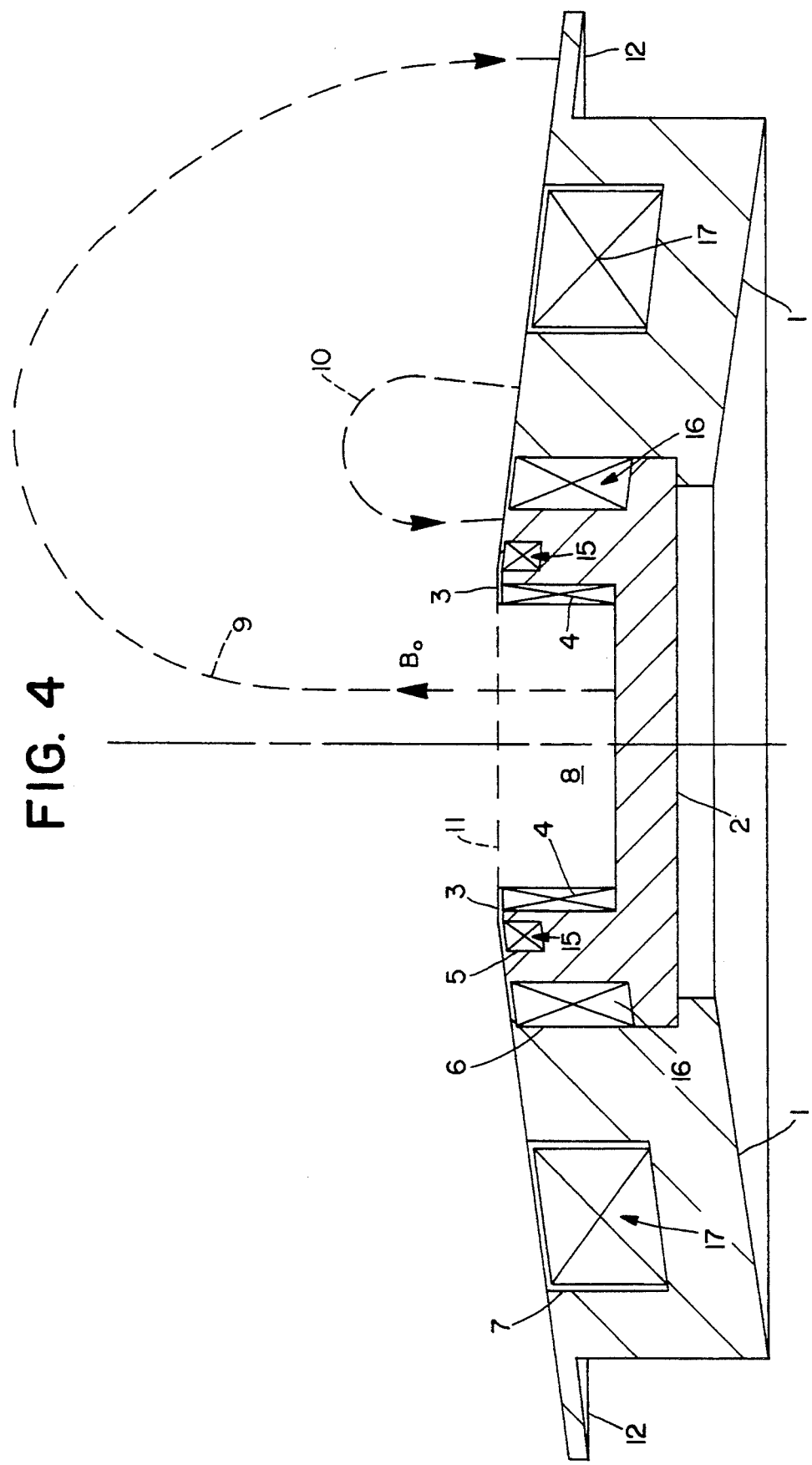

MRI MAMMOGRAPHY MAGNET

BACKGROUND OF THE INVENTION

1. Field of the Invention

The present invention relates to magnetic-resonance imaging apparatus to be used for producing a three-dimensional scan of a human breast (MRI Mammography.)

2. Description of the Related Art

Magnetic-resonance imaging (MRI) is used in medicine to display internal organs of the human body. In this respect it is similar to X-ray "Computed Axial Tomography" (CAT-scan). The most fundamental difference is that in the case of CAT scanning the body is penetrated by X-rays, and in the case of MRI scanning the body is penetrated by a magnetic field and a radio-frequency electromagnetic field. The potential for serious harm caused by the X-rays in the case of a CAT scan is very small, but not zero. In the case of an MRI scan, the potential for harm is supposedly zero. The two methods differ substantially also in that they highlight different features of the anatomy.

One potentially very important area of application of the MRI technique is scanning of the human breast (mammography). If the recommended yearly mammogram (for women over a certain age) can be done as well or better by an MRI technique rather than an X-ray technique, the radiation "load" on the female population will be substantially reduced.

Medical MRI apparatus presently in use, typically, have a solenoid magnet or a set of coaxial coils, large enough for a human to fit inside, several "gradient" coils producing a superimposed "sweep" field and high-frequency coils designed to detect the precession of the hydrogen nucleus (proton) in the magnetic field. With the sweep field turned off, the uniformity of the main field, in the region of interest, is generally of the order of 30 parts per million for MRI apparatus designed to measure and map hydrogen density only.

SUMMARY OF THE INVENTION

The present invention utilizes an electromagnet shaped substantially as a circular disk with a cup indenture (well) at the center for the object to be investigated, a human breast. The main coil for producing the magnetic field is a solenoid inside the cylindrical wall of the well. The disk is made of ferromagnetic materials and has, in addition to the well indenture, several concentric slots to accommodate copper or superconducting coils. The current directions generally alternate from coil to coil and the magnitudes of the ampereturns for each coil have to be carefully adjusted to produce a field which is substantially uniform, not only in the well, but also in the region immediately in front of the well.

The field lines emanating from the cup eventually diverge, in the manner of a fountain and return to the rim of the disc, outside the coil with the largest diameter.

BRIEF DESCRIPTION OF THE DRAWINGS

The invention may best be understood from the following detailed description thereof, having reference to the accompanying drawings, in which:

FIG. 2 is a top view of the magnet of FIG. 1, FIG. 3 is a central cross section of a portion of the embodiment of FIG. 1 on an enlarged scale and showing additional features of the invention, and FIG. 4 is a view, similar to that of FIG. 1, showing a modification of the embodiment of FIG. 1.

DESCRIPTION OF THE PREFERRED EMBODIMENT

Figure 1:
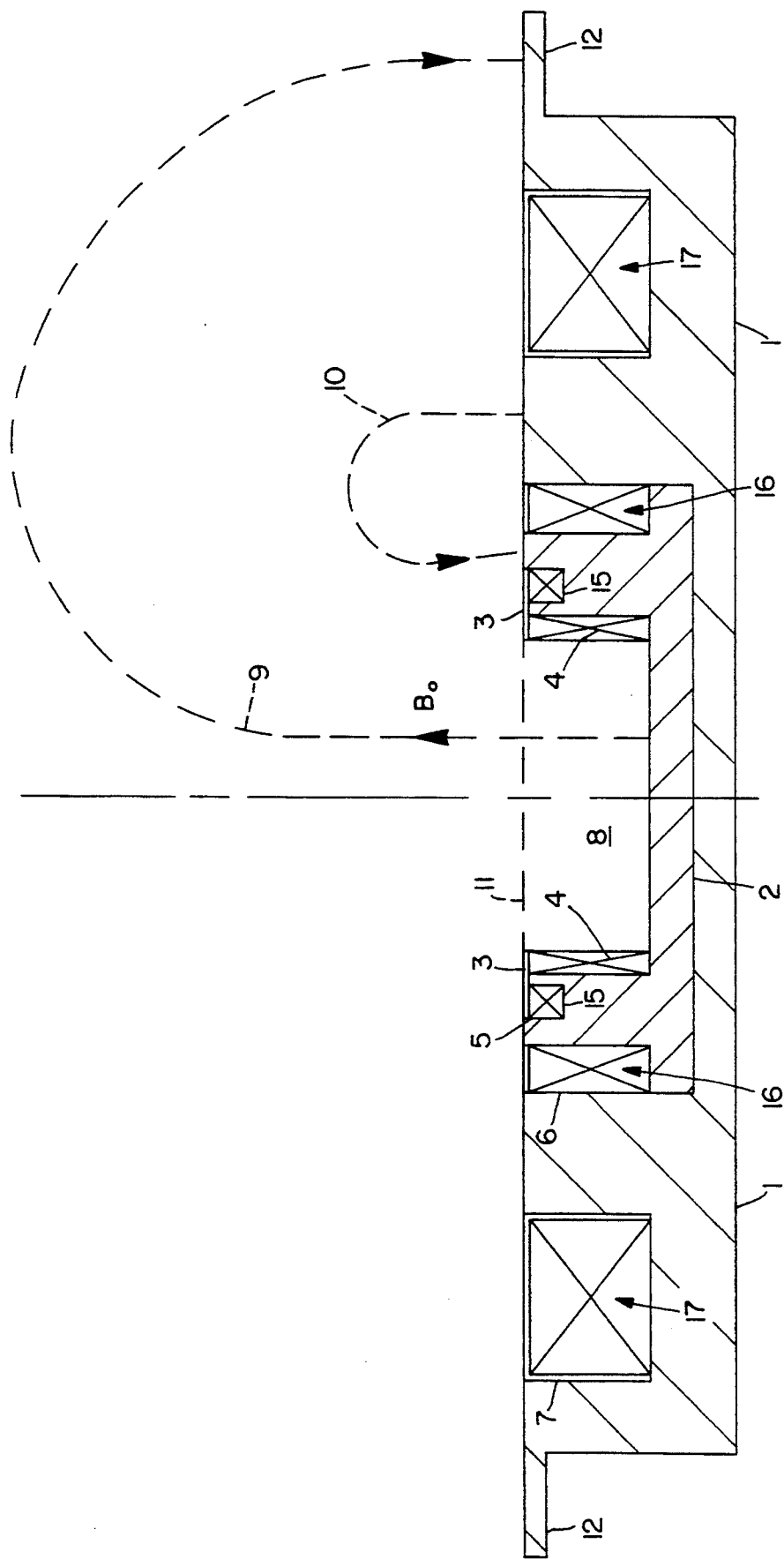
FIG. 1 is a central cross section of one embodiment of the MRI magnet of the invention.

Referring now to FIGS. 1 and 2, in the embodiment therein shown, the main ferromagnetic body of the disk magnet has an upper surface or plane 11 and may conveniently be constructed in three parts, comprising an outer annulus 1 made of low-carbon steel, an inner annulus 2 and a flat ring 3, said inner annulus 2 and said flat ring 3 both being preferably made of a high-permeability nickel-iron alloy such as Carpenter High Permeability "49" Alloy (a trade mark used by Carpenter Technology Corporation to identify a high-permeability alloy which is a 48% nickel-iron alloy typically comprising 0.02% carbon, 0.50% manganese, 0.35% silicon, 48.00% nickel, and the balance iron). The outer annulus 1 may have an outwardly projecting flange 12. The inner annulus 2 forms a central cylindrical well 8 which is lined with a solenoidal current-carrying coil 4. An inner slot 5 (FIG. 1) is formed in the upper surface of the inner annulus 2 and contains a current-carrying coil 15 (FIG. 2). The flat ring 3 is positioned at the top of the solenoidal coil 4 and extends from the inner edge of the solenoidal coil 4 outward to the inner edge of the inner slot 5. Thus the solenoidal coil 4 is surrounded on three sides by high-permeability ferromagnetic material. An intermediate slot 6 (FIG. 1) may conveniently be formed between the inner annulus 2 and the outer annulus 1 and contains a current-carrying coil 16 (FIG. 2). An outer slot 7 (FIG. 1) is formed in the upper surface of the outer annulus 1 and contains a current-carrying coil 17 (FIG. 2). The central cylindrical region 8 is the measurement region, and it also contains gradient coils and radio-frequency coils, which may be placed in the space shown at 14 in FIG. 3. It is also possible to include in this region 14 any number of low-current coils for fine adjustment of the field homogeneity.

Current is produced in each of the various coils by means of conventional current sources, well known in the art. Although separate current sources may be used, it is to be understood that a single power source may be used to supply current to a plurality of coils connected in series. It is then necessary to include in each slot a trim coil with its own small adjustable power supply. In general, the coils 15, 16 and 17 will fill their respective slots 5, 6 and 7 to a substantial degree.

The upper surface 11 (i.e. the front) of the disk may be made slightly conical to provide better access to the well 8, as shown in FIG. 4. FIGS. 1 and 4 show the well 8 in the surface which is uppermost in these views. However, in actual use the MRI magnet of FIGS. 1 and 4 may be positioned otherwise, such as a position rotated 90° with respect to that of FIGS. 1 and 4. Therefore, as used herein, the term "upper" means that surface below which the well 8 extends. It should also be noted that the upper surface 11 is intentionally shown in FIG. 1 by a dashed line in order to make it clear that the well 8 is open at the top.

The magnetic field of typically 0.15 Tesla inside the well 8 up to plane 11 is driven by the current in coil 4. Plane 11 must be a magnostatic equipotential. For the purpose of this discussion one might therefore imagine that a very thin sheet with infinite permeability is positioned in this plane. Also for this discussion the materials in items 1, 2, and 3 may by assumption have infinite permeabilities. In the design calculations, of course, the reluctances of these parts are included. In this simplified model Ampere's Law applies to the field integral inside the well 8 with the current in coil 4 being the driving magnetomotive force. Outside the equipotential 11, the field integral, for instance taken along the field line 9, obeys Ampere's Law with the magnetomotive force being provided by the positive contributions from the currents in coils 5 and 7 and a negative contribution from coil 6. The reverse current in coil 6 is necessary for straightening the field line 9 above plane 11 as shown by creation of a reverse field 10.

Another way of looking at the function of coils 5, 6, and 7 is the following:

Assume again that the well 8 is covered with an infinitesimally thin sheet of infinite permeability. A current in any one of the coils 5, 6, or 7 will produce, in the region above 11 and perpendicular to the plane 11 a field with a given radial distribution. The three radial distributions will be different because the coils have different radii. With three variables it is therefore possible to force the field to have the correct numerical value (i.e. matching the field above the plane 11 with the one below the plane 11) at three different radii. If the three radii are strategically chosen, the field will be substantially uniform out to a sufficiently large radius. Calculations to determine the appropriate magnitudes of the currents can be performed with the aid of well-known computer programs such as POISSON. (With respect to such programs reference may be made to the Manual User's Guide for the POISSON/SUPERFISH Group of Codes, Los Alamos National Laboratory Publication LA-UR-87-115.) When the "outside" field is joined with the "inside" field created by the current in coil 4, a uniformity of better than 30 parts per million ensues. This uniformity applies, typically, to a volume defined by 1.1 times the depth of the well 8 and 0.9 times the inner radius of the coil 4.

Some fine tuning of the field can also be made by other parameters, for instance, the inner radius of ring 3 and the inner and outer radii of coils 5, 6, and 7. There is, however, not much flexibility in the choice of coil radii. For instance, calculations on a magnet correctly scaled from FIG. 1 show that the field in the iron between coils 6 and 7 reaches a value approaching 12 times the field in the well 8. With a field in the region of interest, the well 8, of 0.15 Tesla the field in the iron is about 1.8 Tesla, and it is probably not advisable to drive it closer to saturation because of possible nonuniformities in the iron. The field in the central ferromagnetic part (2) is, however, very much lower, making it possible to utilize a material here with superior magnetic properties, as described above.

It is obvious that the field in the well can be further fine tuned by use of weak currents in thin wire loops inside the well to correct angular inaccuracies as well as radial-axial variations. One obvious place for a current loop to provide an additional adjustable parameter is at the top of the well 8, inside ring 3, within the space 14 (FIG. 3). Another obvious place is at the bottom of the well 8, within the space 14 (FIG. 3). In the ferromagnetic material 2, below the well, there is an inward-pointing component of the return field, producing a drop in magnetomotive force from the outside towards the center. This can be compensated for by a flat coil with a relatively weak current in the bottom of the well 8, within the space 14 (FIG. 3).

The inner radius of ring 3 can also be treated as an adjustable parameter for fine tuning of the field near it.

The ferromagnetic ring 3 should be made quite thin because it is important that coil 4 builds up the magnetostatic potential linearly to as close to the top of the well as possible. The magnetic field entering the ring from above is substantially uniform while the field from below decreases linearly to zero from the inner radius $R_1$ to the outer radius $R_2$ of coil 4. The mismatch in the flux from above and the flux from below must be conducted radially out through the ring and through a cross section $2\pi R_2 T$ at the outer radius $R_2$ of the well. Here T is the thickness of the ring. In iron-nickel alloys, such as the aforementioned Carpenter High Permeability "49" Alloy, the field should be kept below approximately 1 Tesla.

A straightforward calculation yields the following formula for this field, with the above assumptions and $W = R_2 - R_1$:

$$B = (B_0 W/2T)(1 - 2W/3R_2) \approx B_0 W/2T$$

For example: With $B_0 = 0.15$ Tesla, $W = 2.5$ cm, and $T = 0.2$ cm the field, according to the approximate formula becomes $B = 0.94$ Tesla.

In order to keep the weight of the magnet to a minimum, the thickness of the magnetic disk can be reduced outside coil 7, as shown in FIG. 1. Flange 12 is thick enough to support the magnetic field at this location without saturation of the iron.

Detailed design calculations have been performed on a magnet having relative dimensions approximately as depicted in FIG. 1 with the inner radius of coil 4 being 12 cm and the depth of the well 8 being 10 cm. The outer diameter of the magnet is 120 cm. The ampereturns needed to produce 0.15 Tesla in the well are for coils 4, 5, 6, and 7 respectively: 11700, 4700, −25200, and 86600 ampereturns. The total power consumption is approximately 50 kW and the total weight of the magnet is about 900 kilograms. For producing a magnetic field in the well 8 differing from 0.15 Tesla one can of course assume a near linear field/current relationship as long as no part of the magnetic circuit is near saturation.

Having thus described the principles of the invention, together with illustrative embodiments thereof, it is to be understood that although specific terms are employed, they are used in a generic and descriptive sense, and not for purposes of limitation, the scope of the invention being set forth in the following claims.

I claim:

1. Electromagnet designed for magnetic resonance imaging comprising in combination a circular disk made of ferromagnetic material and having a surface with a central cylindrical well extending below said surface and, at various larger radii, three or more concentric circular slots extending below said surface, a solenoidal current-carrying coil mounted in said well so as to form a lining therein, a current-carrying coil mounted in each of said slots, means for producing current in said coils, respectively, whereby a magnetic field is produced in said central well inside said solenoidal coil, the currents in said coils being adjusted to produce a substantially uniform magnetic field in said central well inside said solenoidal coil.

2. Electromagnet in accordance with claim 1, wherein said circular disk comprises an outer annulus and an inner annulus, and wherein said three slots comprise an outer slot formed in the surface of said outer annulus, an intermediate slot formed between said outer annulus and said inner annulus, and an inner slot formed in the surface of said inner annulus.

3. Electromagnet in accordance with claim 2 in which the magnetic material of the inner annulus is of a high-permeability alloy and the magnetic material in the outer annulus is low-carbon steel or another ferromagnetic material with a higher saturation field.

4. Electromagnet in accordance with claim 1 in which the end of the solenoidal coil at the open end of the well is covered, more or less, with a flat ring made of ferromagnetic material.

5. Electromagnet in accordance with claim 4, in which said flat ring is made of a high-permeability alloy.

6. Electromagnet in accordance with claim 4 in which the inner radius of said ring is adjusted to maximize the homogeneity of the field in the central well.

7. Electromagnet in accordance with claim 4 in which there is a fifth current-carrying coil at or close to the inner radius of the aforementioned flat ring.

8. Electromagnet in accordance with claim 5 in which there is a fifth current-carrying coil at or close to the inner radius of the aforementioned flat ring.

9. Electromagnet in accordance with claim 6 in which there is a fifth current-carrying coil at or close to the inner radius of the aforementioned flat ring.

10. Electromagnet in accordance with claim 1 in which, when adjusted to produce a field of 0.15 Tesla in the cylindrical well, the ampereturns of the four coils listed in order of increasing radii, are approximately: 11700, 4700, −25200, and 86600.

11. Electromagnet in accordance with claim 1 in which one or more current-carrying loops in the central well are used to further improve the homogeneity of the magnetic field.

12. Electromagnet in accordance with claim 1 in which the central well also contains coils for producing varying gradients of the field and radio-frequency coils for detection of nuclear magnetic resonance.

13. Electromagnet in accordance with claim 1 designed for use in Magnetic-Resonance-Imaging apparatus for study of the human breast.

* * * * *